United States Patent [19]

Nelson et al.

[11] Patent Number: 5,663,597
[45] Date of Patent: Sep. 2, 1997

[54] RF DEVICE PACKAGE FOR HIGH FREQUENCY APPLICATIONS

[75] Inventors: Stephen R. Nelson; Buford H. Carter, both of Richardson; Dennis D. Davis, Garland; Tammy J. Lahutsky, Plano; John Barnett, Mesquite; Glen R. Haas, Jr., Plano, all of Tex.

[73] Assignee: Texas Instruments Incorporated, Dallas, Tex.

[21] Appl. No.: 344,798

[22] Filed: Nov. 23, 1994

Related U.S. Application Data

[63] Continuation of Ser. No. 967,483, Oct. 26, 1992, abandoned.

[51] Int. Cl.[6] .................. H01L 23/495; H01L 23/48; H01L 23/52
[52] U.S. Cl. .................. 257/734; 257/676; 257/774; 257/775
[58] Field of Search .................. 257/676, 735, 257/774, 775, 734

[56] References Cited

U.S. PATENT DOCUMENTS

| | | | |
|---|---|---|---|
| 4,933,741 | 6/1990 | Schroeder | 357/70 |
| 4,982,268 | 1/1991 | Schuermann | 357/70 |
| 5,019,941 | 5/1991 | Craft | 257/719 |
| 5,028,741 | 7/1991 | Sanders et al. | 174/52.2 |
| 5,072,283 | 12/1991 | Bolger | 357/72 |

FOREIGN PATENT DOCUMENTS

| | | | |
|---|---|---|---|
| 0052054 | 5/1982 | European Pat. Off. | 23/30 |
| 0272187 | 6/1988 | European Pat. Off. | 23/48 |
| 0331289 | 9/1989 | European Pat. Off. | 23/56 |

*Primary Examiner*—Sara W. Crane
*Assistant Examiner*—Valencia Martin Wallace
*Attorney, Agent, or Firm*—Dana L. Burton; James C. Kesterson; Richard L. Donaldson

[57] ABSTRACT

This is a device package comprising: a leadframe comprising a plurality of leads for effecting circuit connections to the device; and a metal ground piece connected to the leadframe. Other devices and methods are also disclosed.

20 Claims, 7 Drawing Sheets

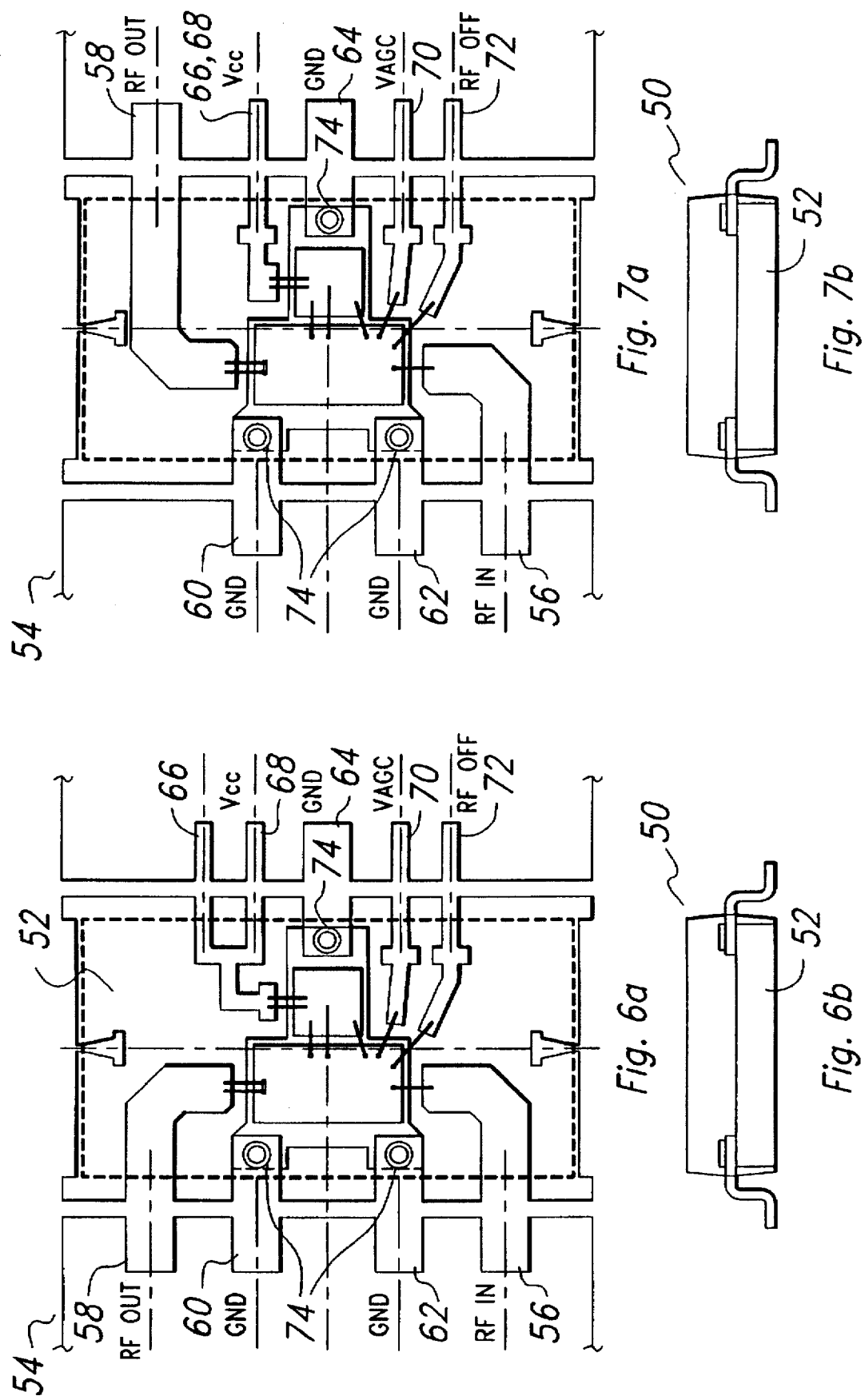

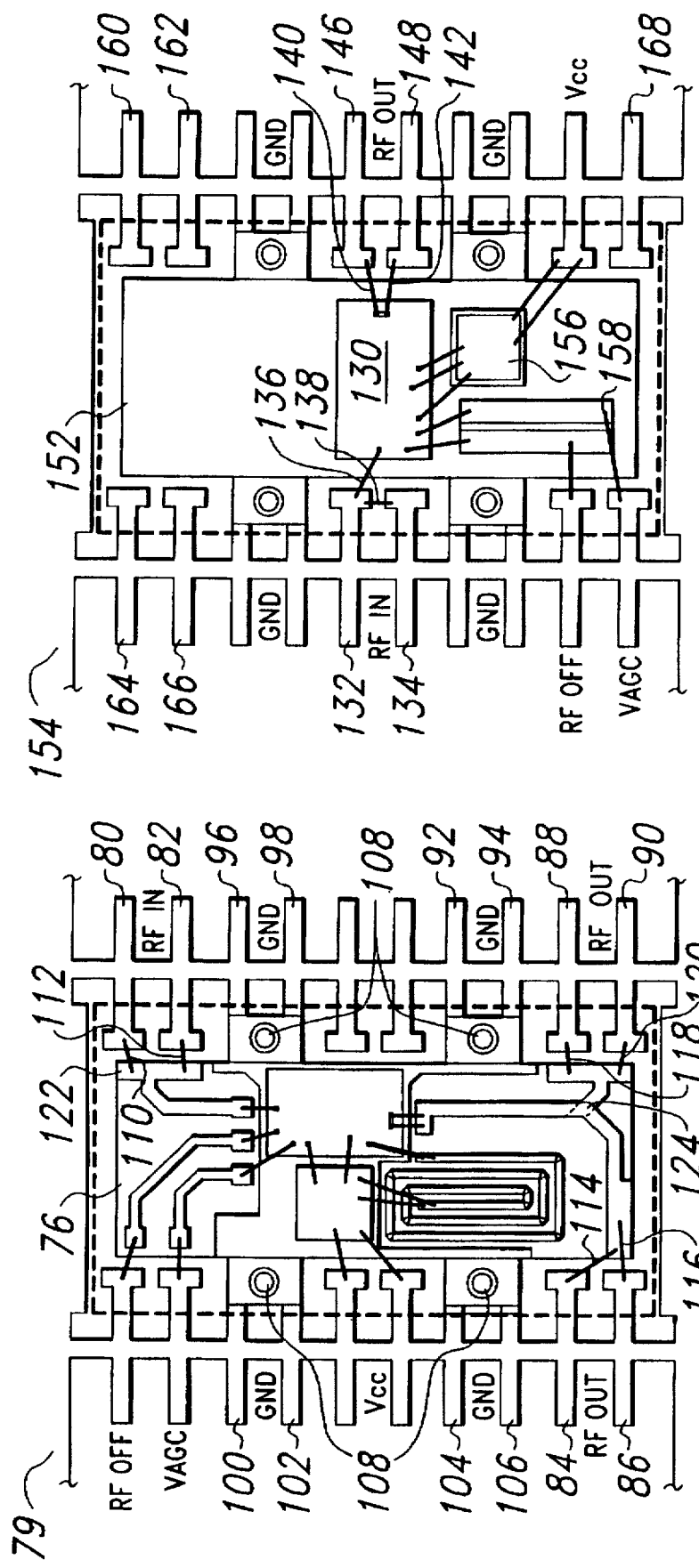
Fig. 9a
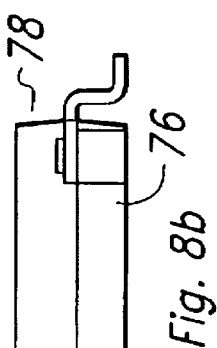
Fig. 9b
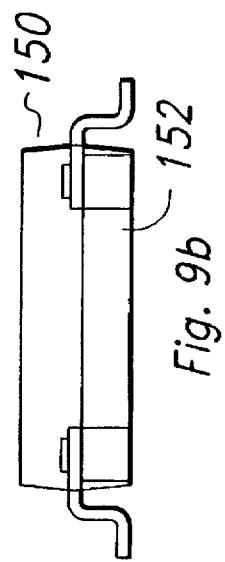
Fig. 8a
Fig. 8b

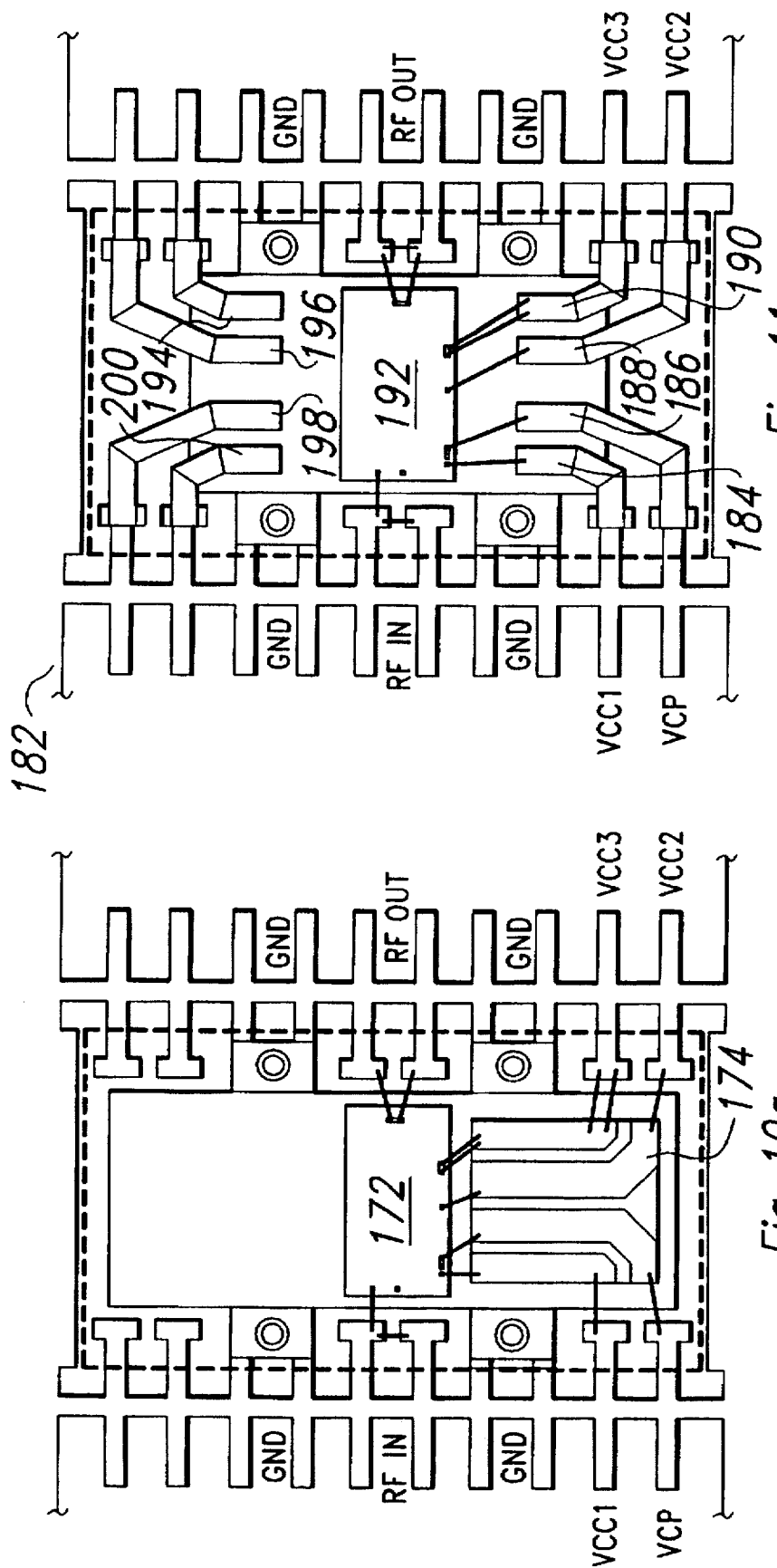
Fig. 11a
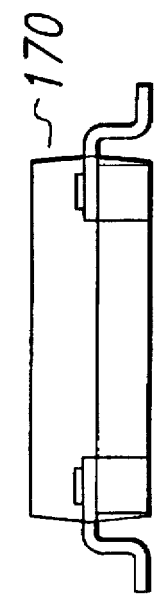
Fig. 11b
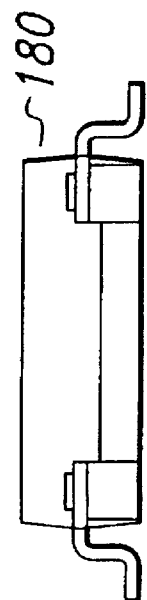
Fig. 10a
Fig. 10b

RF DEVICE PACKAGE FOR HIGH FREQUENCY APPLICATIONS

This application is a continuation of application Ser. No. 07/967,483, filed Oct. 26, 1992 abandoned.

FIELD OF THE INVENTION

This invention generally relates to device packaging.

BACKGROUND OF THE INVENTION

Without limiting the scope of the invention, its background is described in connection with RF device packaging, as an example.

Heretofore, in this field, packages operating at frequencies of 1 GHz or higher were normally of metal-ceramic construction, or metal bases with plastic cavity lids and metal leads sticking through the plastic sides.

Standard SO8, SO14, and SO20 plastic encapsulated packages have been used for RF applications at frequencies up to 1 Ghz. However, these leadframes have high lead inductances which must be accounted for in the design of the ICs inserted into the leadframes. Isolation between leads is also low, typically 20 Db or less at 1 Ghz. This limits the amount of amplifier gain which can be inserted in the packages at microwave frequencies, and creates the potential for coupling problems between RF ports and RF and DC ports.

SUMMARY OF THE INVENTION

It is herein recognized that a need exists for a lower cost, more efficient device package that may be used in higher frequency applications. The present invention is directed toward meeting those needs.

Generally, and in one form of the invention a device package is presented comprising: a leadframe comprising a plurality of leads for effecting circuit connections to the device; and a metal ground piece connected to the leadframe. As examples, the ground piece may be a ground slug connected to a bottom side of the leadframe or a metal ground plane which serves as a base for the package connected to a bottom side of the leadframe.

In another form of the present invention one or more of the leads is substantially wider than the remainder of the leads. Preferably, in operation, some of the wider leads are connected to ground and some carry RF signals. In yet another form of the invention at least some of the leads are grouped together in groups of two or more leads, forming lead groups, to provide a single connection to the device for each of the lead groups.

The package of the present invention may be used with many types of devices. It may be structured and fabricated in many different ways to achieve the advantages of the present invention. Several of these alternatives are described below.

In another form Of the invention a packaged device is presented comprising: a leadframe comprising a plurality of leads for effecting circuit connections to the device; and a metal ground piece connected to the leadframe. As an example, the packaged device may be an amplifier comprising GaAs heterojunction bipolar transistors. The packaged device of the present invention may be a portion of a communication system or a cordless phone.

BRIEF DESCRIPTION OF THE DRAWINGS

In the drawings:

FIGS. 6A and 6B are views of a third preferred embodiment device package and leadframe according to the present invention;

FIGS. 7A and 7B are views of a fourth preferred embodiment device package and leadframe according to the present invention;

FIGS. 8A and 8B are views of a fifth preferred embodiment device package and leadframe according to the present invention;

FIGS. 9A and 9B are views of a sixth preferred embodiment device package and leadframe according to the present invention;

FIGS. 10A and 10B are views of a seventh preferred embodiment device package and leadframe according to the present invention; and FIGS. 11A and 11B are views of an eighth preferred embodiment device package and leadframe according to the present invention.

Corresponding numerals and symbols in the different figures refer to corresponding parts unless otherwise indicated.

DETAILED DESCRIPTION OF PREFERRED EMBODIMENTS

Figure 1A:
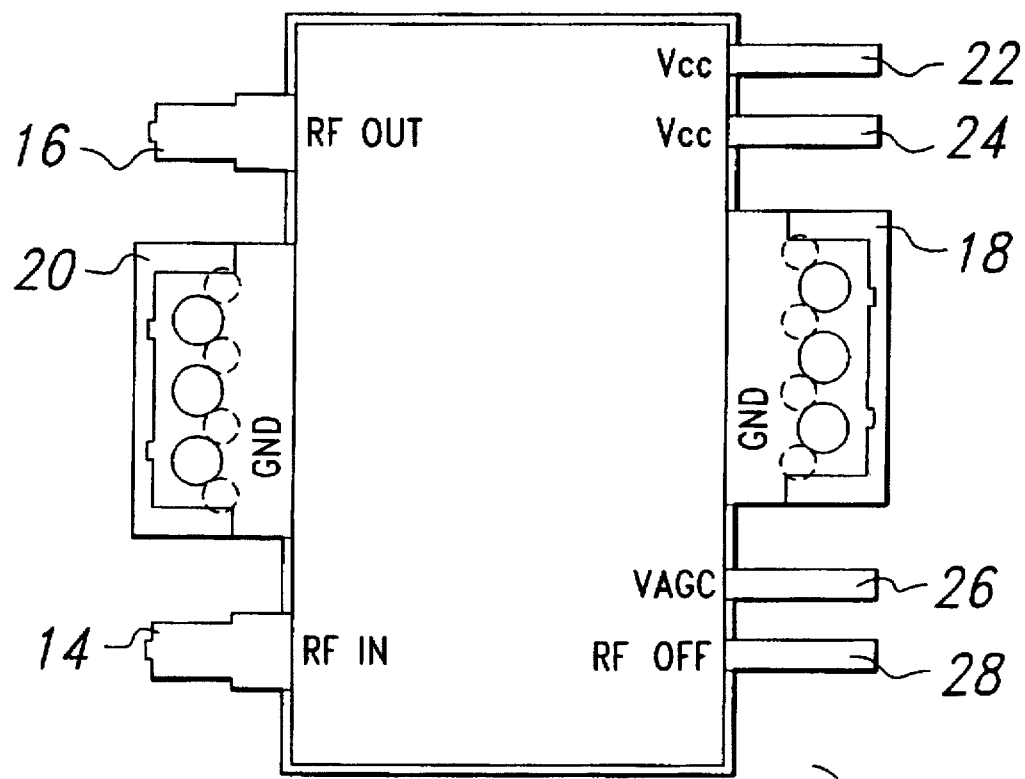
FIGS. 1A and 1B are views of a first preferred embodiment device package according to the present invention.

SO packages embodying the concepts of the present invention have been experimentally designed, built, and tested which operate at frequencies up to 6 Ghz. Unlike conventional standard SO packages, the packages of the present invention offer low insertion loss, low VSWR, and high isolation between RF leads and RF-DC leads at microwave frequencies. The packages offer low ground inductance leads, low ground inductance return paths, and low thermal impedance.

The single-piece SO style leadframes, of one embodiment of the present invention, advance the state-of-the-art by implementing filter and microstrip concepts for selection of the RF lead dimensions to minimize RF port SWR and insertion loss, and increase isolation between RF leads by changing the configuration of ground leads to wide ground bars. In addition, a ground slug may be added to the single-piece SO style package example presented below to increase isolation between RF port leads by 10 to 15 Db over that achievable by any SO single-piece leadframe without a ground slug. The two-piece package example described below has a standard SO20 external outline, and can be encapsulated in standard SO20 molds. The two-piece package example offers up to 6 RF ports, for multiple RF port circuits like switches or mixers, and multiple MMICs could be mounted in the package.

This was achieved by adjusting the leadframe and ground plane or package base layouts to control RF lead(s) characteristic impedance close to 50 ohms, optimizing a low pass filter characteristic of the leads to improve package RF performance; and by creating low inductance metal base and low inductance lead grounds. Placement of these ground leads also increases isolation between RF port leads, and between DC and RF port leads.

The two-piece SO package described below implements a standard SO outer leadframe, but pairs of leads are used to form RF ports or ground lead ports. This helps change the overall RF port characteristic impedance closer to 50 ohms, and with the addition of shunt capacitance at the ends of the RF port leads (through both lead width increases inside the package and shunt capacitance at attachment points on the MMIC and the outer circuit board), a low-pass filter is achieved which provides excellent package RF performance to 6 GHz. The second piece of the two-piece SO package is the metal base which serves both as a low inductance electrical ground return path, and offers low thermal impedance from the MMIC mounted on the package base to the floor of the package. The bottom of the SO package metal base is fully exposed for direct electrical mounting of the base with conductive epoxy or solder to a circuit board. Like the ground slug, this direct metal base feature increases SO package isolation between RF leads by more than 10 dB. The two-piece SO20 package example described below has shown isolation of 45 dB or higher at frequencies to approximately 6 GHz, increasing to greater than 50 dB at approximately 3 GHz and below, between RF ports.

The single-piece and two-piece SO package concepts of the present invention may be applied to SO packages with any number of leads -8, 14, 16, 20, 28, 40, etc.

Standard surface mount SO packages allow IC operation at frequencies to approximately 1 or 2 GHz, but the ICs must be significantly tuned to operate with the package, and maximum IC performance is not achieved. Typical SO packages exhibit high insertion loss at 1 GHz (>1 dB) and high SWR (>2:1 at 1 GHz). Typical SO packages also have low isolation between DC/IF/RF pins, typically 20 dB or less at 1 GHz. This creates coupling problems between different signal inputs, and limits the amount of amplifier gain which can be inserted into the package without creating oscillation problems (typically to less than 20 dB gain). Typical SO packages also have a high thermal impedance, making them unusable for MMICs which dissipate a few watts of power.

Figure 1B:
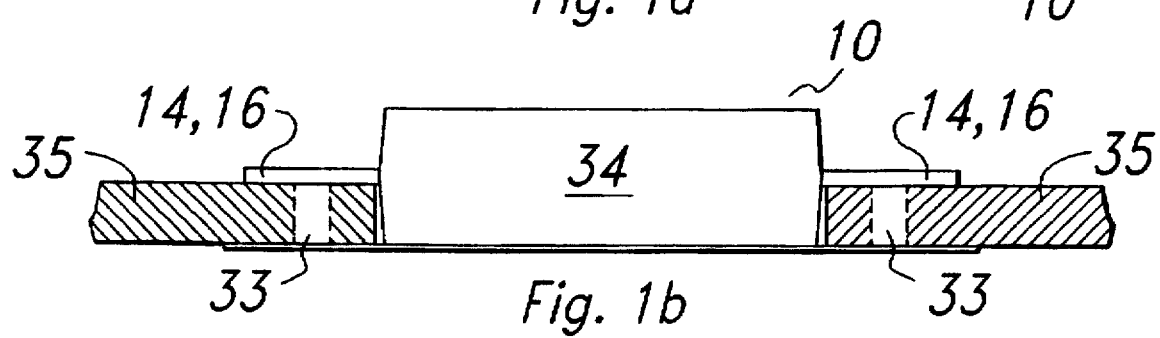
Figure 2:
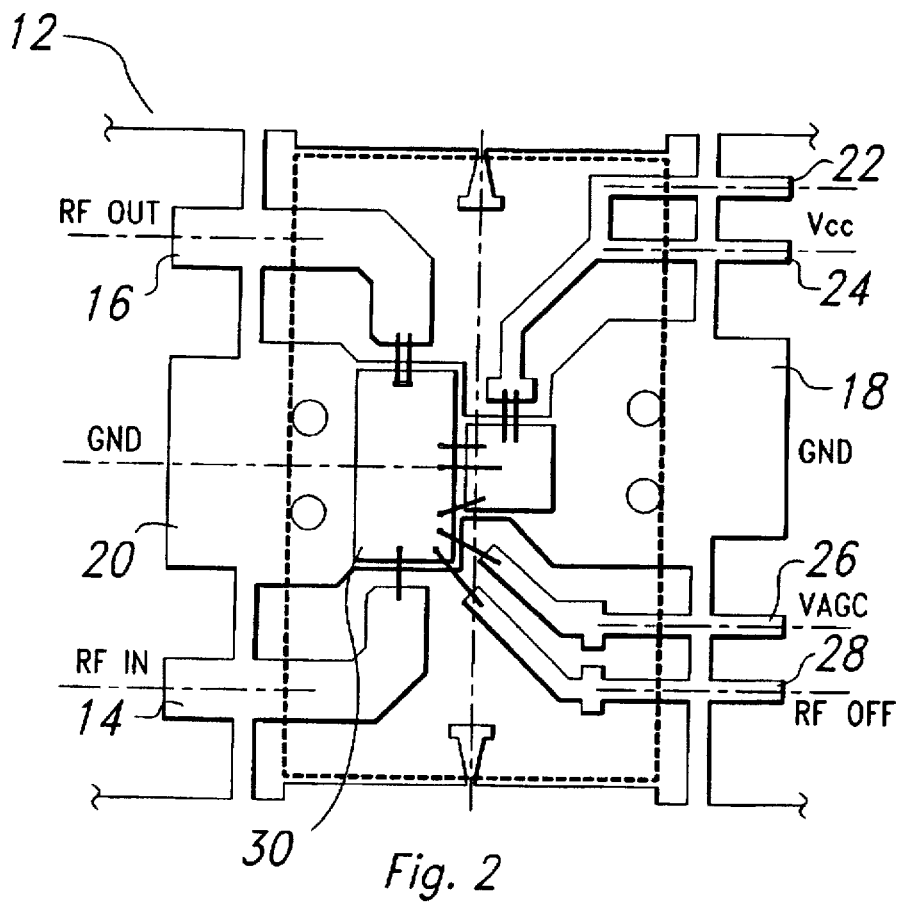
FIG. 2 is a plan view of a first preferred embodiment leadframe according to the present invention.
Figure 3A:
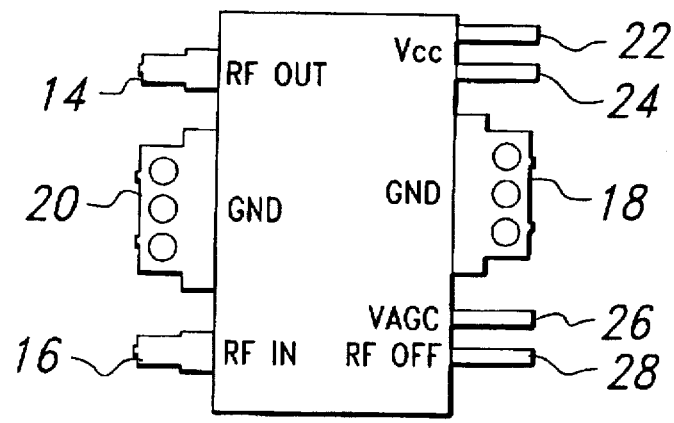
FIGS. 3A and 3B are views of a first preferred embodiment device package according to the present invention.
Figure 3B:
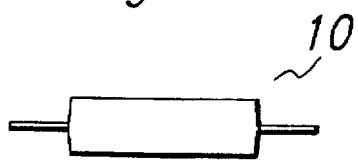

FIGS. 1A, 1B, 2, 3A and 3B show the package 10 and leadframe 12 of an embodiment of the present invention. Referring to FIG. 2, the leadframe 12 has two RF port leads, labeled RF IN 14 and RF OUT 16, and two wide ground port leads 18,20, labeled GND. The remaining four leads 22,24, 26,28 may be used, as an example, to provide bias and control signals to a device such as a transmitter amplifier 30 mounted onto the leadframe 12.

The leadframe 12 in FIG. 2 performs well at frequencies up to 6 GHz for several reasons. The RF IN 14 and RF OUT 16 lead widths are each preferably near 50 mils (1.25 mm), nearly three times as wide as a standard SO lead. This width may be carefully chosen to provide a near −50 ohm characteristic impedance for the lead, encapsulated in plastic, placed over a metal ground plane 32 provided by the circuit board and heatsink shown in FIG. 1.

Since this is a single-piece leadframe, the RF conductors characteristics are determined by their lead widths and thickness, the height of the conductor 14,16 above the ground plane 32, the dielectric constant of the plastic encapsulant, and the metal ground plane 32 which must be provided by the circuit board 35. FIG. 1B provides an example way of doing this, by cutting a hole 33 in a circuit board 35 and mounting the package 10 with epoxy 34 to a metal groundplane and heat sink 32. This could just be a metal ground plane in a multilayer circuit board. The height of the microstrip RF leads 14,16 above the ground plane 32 is preferably approximately 40 mils (1 mm). Plated via holes 33 in the circuit board may be used as ground return paths from the package wide ground leads 18,20 to the metal groundplane and heatsink 32.

An alternate approach is to bend the leads of the SO-8-lead RF package downward in a "gull-wing" configuration, so that the package could be surface-mounted to a circuit board. The circuit board would then preferably have a ground plane metal region on top of the board, to be placed beneath the package in the region of the RF conductors. This circuit board top "ground plane" could be connected with vias to lower metal layers in the board.

The ground leads 18,20 shown in FIGS. 1A–3B preferably have widths of nearly 150 mils. These extremely wide leads offer low inductance from the center of the package out to the circuit board. This low inductance ground return path is the primary factor which controls isolation between RF in/out ports 14,16. The lower this inductance can be made, the higher the isolation which can be achieved between package RF ports 14,16.

The wide ground leads 18,20 help act as shields between other ports of the circuit. For instance, the RF in 14 and out 16 port leads are separated with a wide ground lead 20 between them. This lead 20 reduces coupling of signals between the RF leads 14,16, improving isolation between the RF leads 14,16.

Figure 4A:
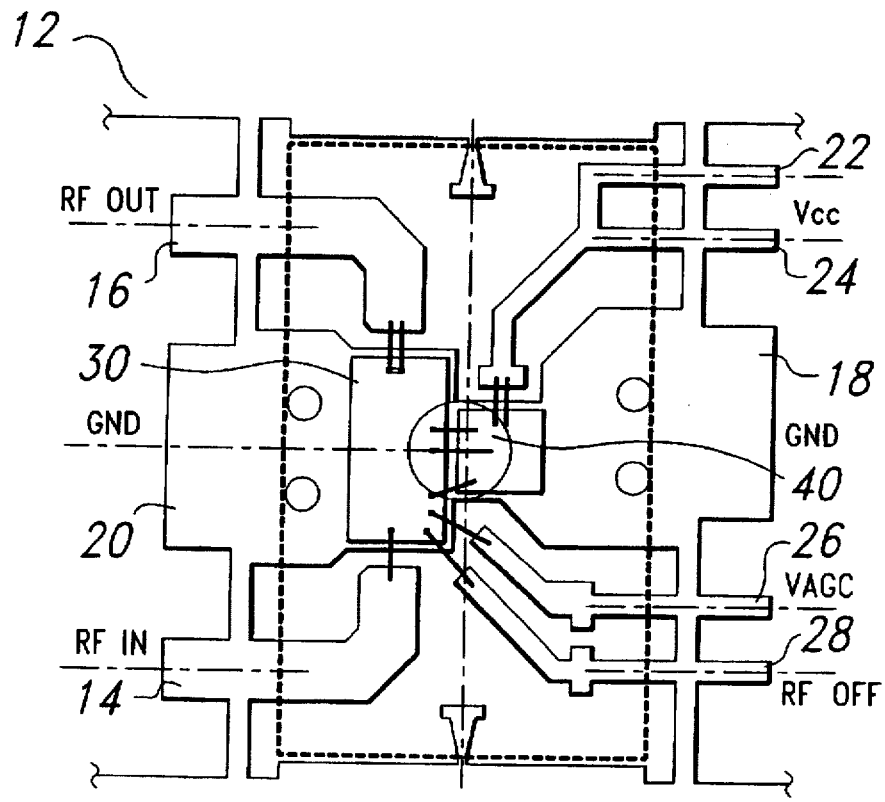
FIGS. 4A and 4B are views of a second preferred embodiment device package and leadframe according to the present invention.

SO package isolation may be further improved by providing a ground slug 40, shown in FIG. 4A, to be connected from the bottom center of the leadframe 12, directly to a circuit board underneath the package 10. This significantly reduces the length and inductance of the package ground return path, increasing isolation between RF ports 14,16.

Figure 4B:
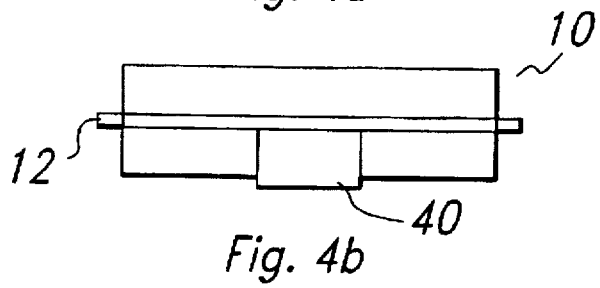

The ground slug 40 is, for example, a circular or rectangular metal disk which may be epoxied onto the bottom of the leadframe. After molding the package 10, the slug 40 is preferably exposed at the bottom of the package 10, allowing direct electrical and thermal contact to the metal slug 40. The slug 40 is represented as a circle in the center of the leadframe 12 in the top view of the drawing shown in FIG. 4A. A side view of the package in FIG. 4B shows the bottom of the slug 40 fully exposed after molding of the package 10.

Attaching a ground "slug" 40—preferably a circular or rectangular disk of metal—to the package leadframe 12 has been experimentally shown to increase isolation between RF ports 14,16 by 10 to 15 dB at 1 GHz, and isolation was also increased at higher frequencies.

Note that this ground slug approach and concept could be applied to any SO-xx leadframe to improve RF performance and isolation of any SO-xx package. The wide leads concept, described above, can be used in concert with the ground slug or they may be employed individually, as desired.

Figure 5:
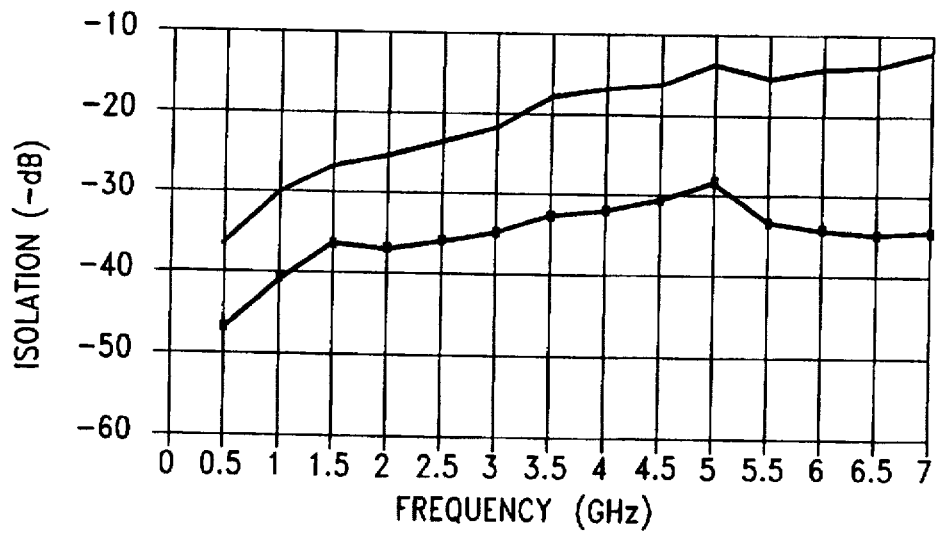
FIG. 5 is a graph of performance results of device packages according to the present invention.

Measured performance of SO-8-lead RF packages, with and without ground slugs, was measured to 10 GHz, and plotted to 7 GHz, as shown in FIG. 5. FIG. 5 shows that measured RF port-to-port isolation with RF ports 14,16 terminated in short circuits was increased from 30 dB at 1 GHz for the SO package without ground slug, to 40 dB for the SO package with ground slug 40, a 10 dB increase (factor of 10 improvement).

Table 1 below briefly summarizes measured RF performance of the SO-8-lead single-piece leadframe package (FIGS. 1–4), with and without ground slugs.

TABLE 1

Measured Performance of Single-Piece SO-8 RF Leadframe Packages, with/without Ground Slugs; Frequency = 1 GHz; Applies to RF IN & RF OUT Ports (Internal RF ports terminated in short ckts.)

|  | INSERTION LOSS (dB) | VSWR | ISOLATION BETWEEN RF PORTS (dB) |
| --- | --- | --- | --- |
| NO GND SLUG: | 0.08 | 1.03 | 30.5 |
| WITH GND SLUG: | 0.09 | 1.10 | 40.5 |

For different terminations on the package internal RF ports, like open circuits and 50 ohm loads, isolation between RF ports 14,16 was measured at greater than 40 dB and 50 dB at 1 GHz, for the no ground slug and with ground slug 40 cases, respectively.

The SO-8 RF package with ground slug 40 isolation of 40 dB shown in Table 1 is some 20 dB, i.e., 100 times, higher than that of a standard SO-xx leadframe package at 1 GHz. In addition, the VSWR and insertion loss of the package, with or without ground slugs, is greatly improved over that of a standard SO-xx leadframe at 1 GHz. A standard SO-xx leadframe package could exhibit insertion loss greater than 1.0 dB and VSWR greater than 2:1 at 1 GHz.

The 2-piece SO package approach, preferably has separate leadframe and separate metal ground plane package base. Although the measured performance for the single-piece SO-8 RF package is very good and represents a major improvement over RF performance achievable with standard SO-xx leadframes, it is desirable for some applications to further improve the isolation between RF ports at 1 GHz to a level of, for example, 60 dB isolation between RF ports at 1 GHz. The two-piece package of the present invention provides significantly higher isolation between RF ports.

A preferred embodiment of the two-piece SO-20 package is shown in FIGS. 6A and 6B. It was called an SO-20 package because it had nearly the same outer dimensions of a standard SO-20 package, but fewer leads. The package 50 in FIGS. 6A and 6B has two pieces, preferably a rectangular metal bar ground plane 52 also referred to as the package base, and an upper leadframe 54. The circular metal ground slug 40 in FIG. 4A has preferably been replaced with a rectangular metal ground bar 52 (package base). This metal base 52 is much larger and covers much more area than the ground slug 40 in FIG. 4A. The rectangular package base metal ground bar 52 provides an excellent low inductance ground return path, and serves as the ground plane for the RF conductors 56,58 which are above it in FIGS. 6A and 6B. The RF conductors 56,58 can be placed closer to the ground plane 52 in FIGS. 6A and 6B than for the package in FIGS. 4A and 4B, which relies on the circuit board below the package to provide the ground plane. By reducing RF conductor 56,58 height above the ground plane from 40 mils in FIG. 4B, to approximately 10 mils or 20 mils (not shown in the side view in FIG. 6B), radiative coupling between RF leads 56,58 and RF 56,58 and DC 66,68,70,72 leads may be significantly reduced, increasing isolation between RF leads 56,58. This also reduces the width of the lead required to achieve 50 ohms characteristic impedance. The metal base 52 of the package in FIG. 6B, like the ground slug 40 in FIGS. 4B, is fully exposed at the bottom of the package 50, allowing for direct electrical and thermal path connections, using conductive epoxy or solder.

GND (ground) leads 60,62,64 of the upper leadframe 54 may be connected to the package base metal bar 52 using, as an example, something akin to a rivet 74. These connections 74 reduce ground path inductance further. The GND leads 60,62 are placed between the RF in 56 and out ports 58, as they were earlier in FIG. 4A, to act as a shield to reduce coupling between RF leads 56,58 and to improve isolation between RF leads 56,58.

FIG. 7A shows an alternate embodiment of the two-piece SO-20 package, with RF input 56 and output 58 ports no longer on one side of the package, but entering the package diagonally. This could provide some improvement in isolation between RF leads if desired.

The circuit in FIG. 8A is a two-piece SO-20 package using a metal base similar to that in FIGS. 6A and 7A, but the leadframe 79 this time has 20 external leads with the same external layout as a standard SO-20 leadframe. The metal base 76 in FIG. 8A is represented by the solid line inner rectangle, with four "ears" protruding from the sides where the ground leads are connected to the base.

FIG. 8A shows the use of a pair of leads to form a RF port 80/82, 84/86, 88/90, and modeling has shown that a near 50 ohm characteristic impedance could be achieved with this approach for RF ports made up of pairs of leads 80/82, 84/86, 88/90, if the entire structure was viewed as a low-pass filter, with a series inductance (the leads), shunted on both sides by capacitance (a shunt C-series L-shunt C low-pass filter).

FIG. 8A also shows using pairs of leads for the ground leads 92/94, 96/98, 100/102, 104/106, to reduce ground lead inductance. Each pair of ground leads is connected to the package base 76, for example with rivets 108. This connects the two pieces of the package together. RF port leads 80/82, 84/86, 88/90 and ground leads 92/94, 96/98, 100/102, 104/106, are preferably alternately spaced, making maximum use of the shielding effect of the ground leads 92/94, 96/98, 100/102, 104/106, to increase isolation between RF pairs of leads 80/82, 84/86, 88/90.

To form an RF port 80/82, 84/86, 88/90 in FIG. 8A, two bond wire 110/112, 114/116, 118,120 connections normally should be made from an MMIC RF port over to each lead of the package RF port pair 80/82, 84/86, 88/90.

Flexibility is offered by the package leadframe 79 arrangement shown in FIG. 8A. Up to 6 two-lead pairs can be accessed as RF ports. Each is isolated from the next RF port by a ground lead and/or the package metal base. Assume a single-pole, double-throw (SPDT) switch were to be assembled inside the package. Three pairs of leads would be used for the RF ports, and remaining leads would be used to provide control signals to the switch. The SO20 RF two-piece package could also be used with SP3T switches, which require 4 RF ports, and there would still be four package "DC" leads left for control signals.

The layout flexibility of the SO-20 RF package makes this package very attractive for analog and digital multiport circuit applications across, for example, DC –6 GHz.

FIG. 9A shows an embodiment inserting, for example, an HBT amplifier 130 in the SO20 RF package 150. Note the RF input port 132/134. A single wire 136 may be used to connect from, for example, a MMIC RF input to one of the package RF port's lead pairs 132/134, and the two package leads may be connected together inside the package with a short bond wire 138. The RF output port 146/148 shows the normal bond arrangement of two bond wires 140/142, one going to each lead 146/148.

FIG. 9A also shows that in addition to, in this example, an HBT amplifier 130 MMIC mounted onto the package base 152, other devices such as a MOSCAP 156 and a ceramic thin- or thick-film circuit 158 may also be mounted to the package base 152. The ceramic circuit 158 with, for example, conductors on its surface may be used to minimize wire lengths inside the package 150. This also provides an example of the flexibility of the package to accept multiple components. There are still five unused leads 160, 162, 164, 166, 168 in the example package configuration shown in FIG. 9A.

A circuit, such as an amplifier circuit, is shown mounted into the RF SO20 package 170 in FIG. 10A. In this example, the amplifier 172 and a thin- or thick-film circuit 174 on alumina are preferably mounted inside the package 170. The ceramic circuit 174 may again be used to route bias and control signals inside the package 170, and to minimize wire lengths.

FIGS. 11A and 11B show an alternative embodiment of package 180 construction. The leadframe 182 at one or both ends of the package 180 can be extended inward as shown to be close to the device 192. The leadframe conductors 184, 186, 188, 190, 194, 196, 198, 200 can then be bonded directly to the device, without the need for an additional ceramic circuit 158, 174 as shown in FIGS. 9A and 10A.

Figure 12:
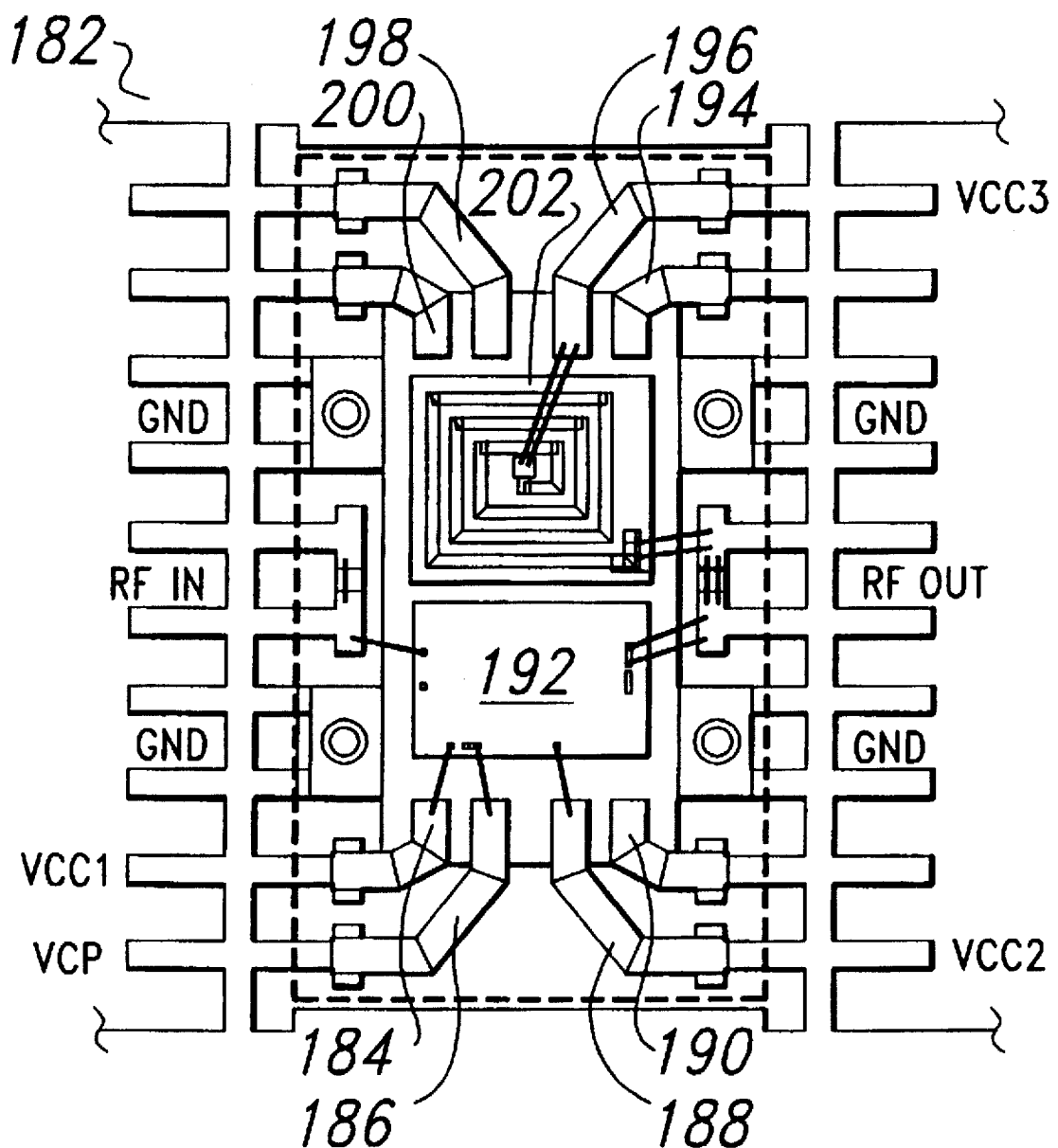
FIG. 12 is a view of a lead frame according to the present invention.

Several embodiments have been shown utilizing the package of the present invention. However, there are many alternatives to and combinations of the embodiments described above. For example, the extended leadframe concept of FIG. 11A could be combined with thin film or thick film networks 202, shown in FIG. 12. Many other embodiments of the present invention are realizable.

Measured RF performance of the two-piece SO-20 RF package has shown that the package operates very well across the DC to 6 GHz frequency range. A brief performance summary is provided in Table 2 below:

TABLE 2

Measured RF Performance of the Two-Piece SO-20 RF Package

| FREQUENCY (MHz) | INSERTION LOSS (dB) | WIRE SHORT CKT. ISOLATION (dB) | VSWR |
|---|---|---|---|
| 870 | <0.10 | 59 | <1.20:1 |
| 1800 | <0.16 | 51 | <1.20:1 |
| 2400 | <0.16 | 49 | <1.20:1 |

This package achieved near −60 dB WORST CASE short circuit isolation at 1 GHz (the isolation between RF ports when the package internal ports are short-circuited to ground). Therefore, devices such as high gain transmitter amplifiers, with gain levels to 40 dB or more, could be placed inside the package without fear of creating oscillation or feedback problems. The low package VSWR and insertion loss also mean that MMIC performance will be changed little by the package.

The two-piece SO-xx RF package may provide isolation levels between RF ports some 40 dB, i.e., 10,000 times, higher than that which could be achieved using standard SO-xx packages at 1 GHz.

An additional advantage associated with the RF SO20 package is that it should be possible to encapsulate the metal base and leadframe using standard SO20 molds. This will reduce tooling costs significantly. A method of accomplishing this, as an example, is to indent the bottom of the package metal base,in this example, by about 5 mils in a small rectangular region at the center of the base, in order to avoid contact with raised letters which may be present in the mold. In this way the package bases can be placed in an array in the molds and not contact these letters. The indented region during package assembly onto circuit boards will not be critical to package performance, and will be partially filled by epoxy or solder.

The metal package base and pair-of-leads, pair-of-ground leads leadframe layout can be applied to SO-8, 14, 16, 20, 28, etc. pin packages, to create a family of high performance, high isolation packages. In addition, performance of TSOP and other package types could benefit from these concepts.

The package base could be made somewhat smaller at the lengthwise ends of the package if desired; non-RF leads do not require a package base ground plane.

For non-RF leads spacers are not necessarily needed during a bonding process. Therefore if leads are extended inside the package, as in FIG. 11A, ceramic or plastic spacers may not be required.

Very similar RF performance results have been measured for circuits mounted in SO-RF packages and encapsulated with optically clear plastic, and for those encapsulated in standard black opaque plastic. Optically transparent plastics open up potential applications for packaging light sensitive ICs. Input signals to the plastic packaged IC or modulation of an amplified signal could be provided/controlled by light. Red and black-IR transparent dyed plastics, for example, are also available which transmit only red or IR wavelengths.

Several preferred embodiments have been described in detail hereinabove. It is to be understood that the scope of the invention also comprehends embodiments different from those described, yet within the scope of the claims. For example, while the present invention has been described in relation to an RF HBT amplifier, any devices which would benefit from the advantages of the package of the present invention. Similarly, the exact placement of devices inside the package, and the number and layout of pins may vary as needed. The concepts of the present invention may also be incorporated into other types of packages besides the SO. Experimental data has been provided at certain frequencies, however, the package of the present invention has the potential to work well in several frequency bands. For example, X-band frequency applications are also possible. The packages and concepts of the present invention will be applicable to a wide range of present and future silicon and GaAs analog and digital integrated circuits. As an example, the present invention would be applicable in cellular telephone technology. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A package for a device comprising:
   a. a leadframe comprising leads for effecting circuit connections to said device wherein at least one of said leads is an RF lead having a low pass filter characteristic;

b. a metal ground piece separate from but connected to said leadframe on a frontside of said metal ground piece and exposed on a backside of said metal ground piece after encapsulation;

c. one or more RF port lead pairs each comprising a coupled lead pair formed from said leads; and d. one or more ground lead pair each comprising a coupled lead pair formed from said leads.

2. The package of claim 1, wherein said ground piece is a ground slug.

3. The package of claim 1, wherein said ground piece is a metal ground plane which serves as a base for said package.

4. The package of claim 1, wherein one or more of said leads is substantially wider than the remainder of said leads.

5. The package of claim 4, wherein, in operation, said wider leads are connected to ground.

6. The package of claim 4, wherein, in operation, said wider leads carry RF signals.

7. The package of claim 1, wherein said RF ports are separated by ground leads.

8. The package of claim 1, wherein said RF ports are essentially diagonal to each other in said package.

9. The package of claim 1, wherein said RF ports are on opposite sides of said package.

10. The package of claim 1, wherein said leadframe is extended inward to facilitate connection to said device.

11. The package of claim 1, wherein a ceramic circuit is used to route signals and minimize wire lengths.

12. The package of claim 1, wherein multiple components are installed therein.

13. The package of claim 1, wherein said package is encapsulated in optically transparent plastic.

14. The package of claim 1, wherein said package is a small outline package.

15. A packaged device comprising:

a. a leadframe comprising leads for effecting circuit connections to said device wherein at least one of said leads is an RF lead having a low pass filter characteristic; and b. a metal ground piece separate from but connected to said leadframe on a frontside of said metal ground piece and exposed on a backside of said metal ground piece after encapsulation;

c. one or more RF port lead pairs each comprising a coupled lead pair formed from said leads; and d. one or more ground lead pairs each comprising a coupled lead pair formed from said leads.

16. The packaged device of claim 15, wherein said device is an amplifier.

17. The packaged device of claim 16, wherein said amplifier includes GaAs heterojunction bipolar transistors.

18. The packaged device of claim 15, wherein said device is a portion of a communication system.

19. The packaged device of claim 15, wherein said device is a switch.

20. The packaged device of claim 15, wherein said device is operable in a X-band frequency range.

* * * * *